United States Patent [19]
Sugahara et al.

[11] Patent Number: 5,128,732
[45] Date of Patent: Jul. 7, 1992

[54] STACKED SEMICONDUCTOR DEVICE

[75] Inventors: Kazuyuki Sugahara; Tadashi Nishimura; Shigeru Kusunoki; Yasuo Inoue; Yasuo Yamaguchi, all of Hyogo, Japan

[73] Assignee: Kozo Iizuka, Director General, Agency of Industrial Science & Technology, Tokyo, Japan

[21] Appl. No.: 199,439

[22] Filed: May 27, 1988

[30] Foreign Application Priority Data

May 30, 1987 [JP] Japan ................................. 62-133514
Dec. 24, 1987 [JP] Japan ................................. 62-325524

[51] Int. Cl.$^5$ ........................................... H01L 27/02
[52] U.S. Cl. ................................................. 357/23.7
[58] Field of Search ............................ 357/23.7, 4, 49

[56] References Cited

U.S. PATENT DOCUMENTS 4,472,729  9/1984  Shibata et al. ..................... 357/4
4,489,478 12/1984  Sakurai .............................. 357/23.7

Primary Examiner—William D. Larkins
Attorney, Agent, or Firm—Rothwell, Figg, Ernst & Kurz

[57] ABSTRACT

A stacked semiconductor device has three-dimensional alternate layers of semiconductor elements and insulating layers each electrically insulating the adjacent upper and lower layers of semiconductor elements, formed on a single crystal semiconductor substrate. A semiconductor is deposited in openings formed respectively in the insulating layers to form single crystal semiconductor layers each having the same crystal axis as the single crystal semiconductor substrate respectively over the insulating layers, and semiconductor elements are formed respectively in a plurality of layers. The opening formed through the upper insulating layer reaches the lower layer of the semiconductor element immediately below the same upper insulating layer, and is formed at a position spaced apart horizontally from the opening formed through the lower insulating layer immediately below the same upper insulating layer. A semiconductor for forming the upper layer of a semiconductor having the same crystal axis as the lower layer of a semiconductor is deposited in the opening of the upper insulating layer so that satisfactory lateral epitaxial growth will occur over the insulating layer.

7 Claims, 6 Drawing Sheets

STACKED SEMICONDUCTOR DEVICE

BACKGROUND OF THE INVENTION

1. Field of the Invention

The present invention relates to a stacked semiconductor device and, more specifically, to a stacked semiconductor device comprising a plurality of stacked layers of semiconductor elements and having high quality.

2. Description of the Prior Art

Recently, trials have been made to manufacture a versatile stacked semiconductor device having a plurality of circuit elements stacked in layers in a three-dimensional structure, namely, a so-called three-dimensional circuit device, having an increased component mounting density and diversified functions. In one proposed process of manufacturing a stacked semiconductor device, an insulating layer is formed over a previously formed circuit element, a polycrystalline or amorphous semiconductor layer is formed over the insulating layer, only the semiconductor layer is heated and melted by irradiating the semiconductor layer by an energy beam such as a laser beam to change the polycrystalline or amorphous semiconductor layer into a single crystal semiconductor layer, and then circuit elements are formed in the single crystal semiconductor layer.

FIGS. 1A through 1G are sectional views of assistance in explaining processes of a conventional stacked semiconductor device manufacturing method. In FIG. 1A, indicated at 1 is a single crystal silicon substrate having a principal plane of [100] or silicon substrate having a principal plane of [100] crystallographically equivalent to the former. A circuit element (MOS transistor) A formed in the first layer through an ordinary MOS transistor manufacturing method comprises an oxide film 21, a gate electrode 3, and a source-drain line 4, which is formed of a metal silicide having a high melting point, such as tungsten silicide, which withstands a high-temperature process for stacking. After the circuit element A has been formed in the first layer, an oxide film 22 serving as a first layer insulating film is formed over the first layer by a chemical vapor deposition method (hereinafter referred to as "CVD method"), a resist film is formed over the oxide film 22, and then the surface of the resist film is smoothed by an etch back process. Then a square first opening 5 having sides of 3 μm is formed through the oxide film 22 as a seed to form a single crystal silicon layer having the same crystal axis as the single crystal silicon substrate over the first oxide film 22.

Then, as shown in FIG. 1B, a single crystal silicon layer (hereinafter referred to as "first epitaxial silicon layer") 6 having the same crystal axis as the single crystal silicon substrate 1 is grown by a selective epitaxial process, and then a first polycrystalline silicon film 7 of 0.5 μm in thickness is formed over the entire surface of the oxide film 22 by a CVD method, as shown in FIG. 1C.

Then, as shown in FIG. 1C, the first polycrystalline silicon layer 7 is irradiated by an argon laser beam 8 of 100 μm in diameter by moving the spot of the argon laser beam 8 in the direction of an arrow at a scanning speed of 25 cm/sec. The first polycrystalline silicon layer 7 is melted by the argon laser beam 8 in a molten silicon 72 which solidifies and recrystallizes after the completion of irradiation by the argon laser beam 8. Lateral epitaxial growth starts from the first epitaxial silicon layer 6 serving as a seed during the solidifcation of the molten silicon 72, and thereby the first polycrystalline silicon layer 7 formed over the oxide film 22 changes into a first single crystal layer 71 having the same crystal axis as the single crystal silicon substrate 1. Methods of forming a single crystal semiconductor layer over an oxide film by means of a laser beam are described in detail in U.S. patent application Ser. Nos. 022,717 and 022,402, both filed Mar. 6, 1987.

Then, as shown in FIG. 1D, the first single crystal silicon layer 71 is etched by a photographic etehing process to form a single crystal silicon layer 74 for forming a MOS transistor therein, and to form a single crystal silicon layer 73 to be used as a seed over the epitaxial silicon layer 6.

Then, as shown in FIG. 1E, a second circuit element (MOS transistor) b is formed on the single crystal silicon layer 74 by the same process as that for forming the first MOS transistor A. Shown in FIG. 1E are an oxide film 23, a gate electrode 31, and a source-drain line 41. The source-drain line 41, similarly to the source-drain line 4 of the first circuit element A, is formed of a metal silicide having a high melting point.

A shown in FIG. 1F, after the second circuit element B has been formed, a second oxide film (second layer insulating layer) 24 is formed by a CVD method, the second layer insulating layer 24 is coated with a resist film, and then the surface of the resist film is smoothed by an etch back process. A second opening 50 is formed in the second oxide film 24 in a portion corresponding to the second single crystal silicon layer 73, a second epitaxial silicon layer 61 is grown in the second opening 50, similarly to the first epitaxial silicon layer 6, by a selective epitaxial growth process, a second polycrystalline silicon layer, not shown, is formed over the entire surface of the planarized second oxide film 24 and the single crystal silicon layer 73 by a CVD method, and then the second polycrystalline silicon layer is irradiated by a laser beam to change the second polycrystalline silicon layer into a second crystal silicon layer 75.

Then, as shown in FIG. 1G, the second single crystal silicon layer 75 is etched in a desired pattern in the same manner as that for forming the first and second layers, and a gate electrode 301, an oxide film 203, and a source-drain line 401 formed of a metal silicide having a high melting point are formed over the second single crystal silicon layer 75 to construct a third circuit element (MOS transistor) C. thus a three-layer three-dimensional circuit device is fabricated.

In the conventional stacked semiconductor device manufacturing method, the second epitaxial silicon layer 61 is used as a seed to change the second polycrystalline silicon layer into the second single crystal silicon layer 75 having the same crystal axis as the single crystal silicon substrate 1. However, since the second epitaxial silicon layer 61 is connected through the single crystal silicon layer 73 to the first epitaxial silicon layer 6, and the thermal conductivity of the silicon is greater than that of the oxide film, heat is transferred through the second epitaxial silicon layer 61, the single crystal silicon layer 73 and the first epitaxial silicon layer 6 to the single crystal silicon substrate 1 in irradiating the second polycrystalline silicon layer by a laser beam to change the second polycrystalline silicon layer into the single crystal silicon layer. Consequently, the temperature of the second polycrystalline silicon layer is able to rise only slightly and the second polycrystalline silicon layer is unable to melt, and hence lateral epitaxial growth does not occur. Accordingly, such a conventional stacked semiconductor device has a problem that the electrical characteristics of the third circuit element C are very inferior. Methods have been proposed to solve such a problem, in which the diameter of the second opening 50 for forming the second epitaxial silicon layer 61 is reduced to a diameter on the order of 2 μm or an antireflection film capable of preventing the reflection of the laser beam is formed over the second epitaxial silicon layer 61. However, in those methods, the second polycrystalline silicon layer formed over the second epitaxial silicon layer 61 is unable to melt.

When the opening for changing the polycrystalline silicon layer into the second single crystal silicon layer 75 having the same crystal axis as the single crystal silicon substrate 1 to form the third circuit element C is formed directly above the opening 5 for the second circuit element B, the temperature of the polycrystalline silicon formed in the opening rises only slightly and the polycrystalline silicon does not melt and hence the lateral epitaxial growth does not occur, because the thermal conductivity of silicon is greater than the oxide film.

Furthermore, such phenomena become more and more remarkable with increase in the thickness of the layer insulating film, and hence it has been impossible to melt the polycrystalline silicon formed in the opening in recrystallizing the polycrystalline silicon layer to form the third layer. To solve such a problem a trial has been made, in which the size of the opening is reduced to suppress heat conduction. However, the size of the opening must be 0.5 μm or below to enable the polycrystalline silicon to melt in the opening, which entails problem in the reliability of the process for forming the opening.

SUMMARY OF THE INVENTION

The present invention has been made to solve the foregoing problems. It is therefore an object of the present invention to provide a stacked semiconductor device which enables satisfactory lateral epitaxial growth in the process for manufacturing the same.

It is another object of the present invention to provide a stacked semiconductor device comprising a plurality of layers each including a semiconductor layer having the same crystal axis as the substrate.

In a stacked semiconductor device of the present invention, an opening for forming an upper semiconductor circuit element, formed through a layer insulating layer formed over a previously formed lower layer of a semiconductor circuit element formed immediately below the upper layer of a semiconductor circuit element is formed at a position different from an opening formed in the lower layer of a semiconductor circuit element, and a semiconductor layer for taking the crystal axis of the lower layer of a semiconductor circuit element is formed in the opening.

In a preferable constitution, the opening has an area of 9 μm² or less and the position of the opening for the upper layer of a semiconductor circuit element is spaced apart horizontally by 8 μm or greater from the position of the opening for the lower layer of a semiconductor circuit element.

BRIEF DESCRIPTION OF THE DRAWINGS

In the drawings, like reference numerals and characters designate like or corresponding parts throughout.

DETAILED DESCRIPTION OF THE INVENTION

A stacked semiconductor device, in a preferred embodiment, according to the present invention will be described hereinafter with reference to the accompanying drawings.

Figure 2:
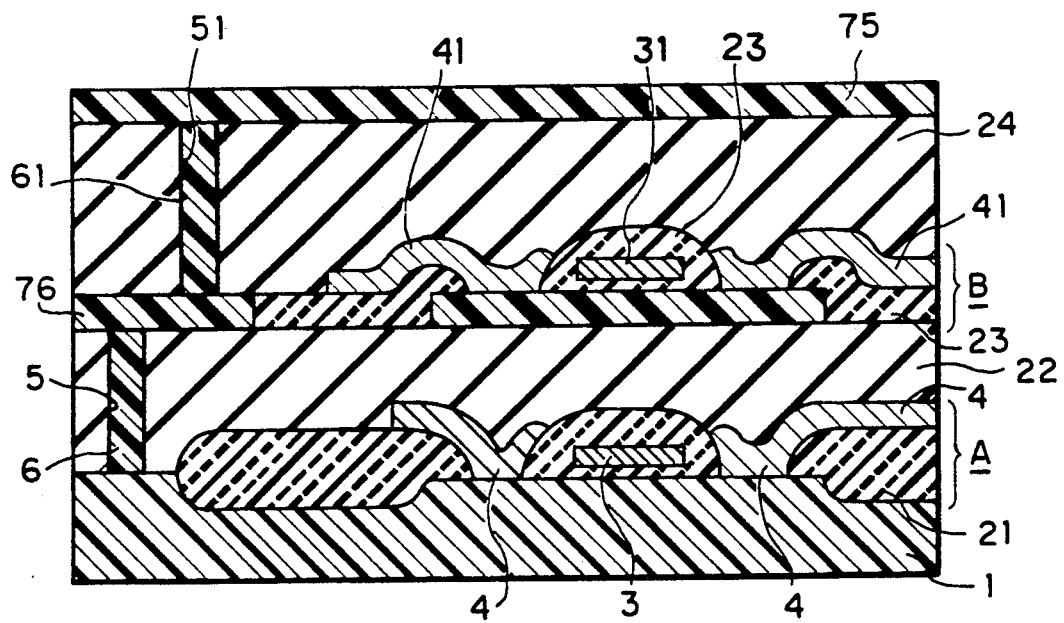
FIG. 2 is a sectional view of a stacked semiconductor device embodying the present invention.

Referring to FIG. 2 showing a stacked semiconductor device, in a preferred embodiment, according to the present invention, there are shown a single crystal silicon substrate 1 formed of silicon having a principal plane of [100] or a principal plane equivalent to the principal plane of [100], layer insulating oxide films 22 and 24, a square opening 51 having sides of 3 μm for forming a third silicon film having the same crystal axis as the single crystal silicon substrate 1, single crystal silicon layers 6 and 76, polycrystalline silicon 61 deposited in the opening 51, polycrystalline silicon 75, a first MOS transistor A, and a second MOS transistor B.

In FIGS. 3A to 3E, indicated at 76 is a single crystal silicon layer formed on a first layer insulating oxide film 22 at a position apart from the first epitaxial silicon layer 6. Layer 76 serves as a seed for the polycrystalline silicon 61 in changing the second polycrystalline silicon layer into a single crystal layer, and at 51 is a second opening formed through the second layer insulating oxide film 24 at a position corresponding to the single crystal silicon layer 76.

A method of manufacturing the stacked semiconductor device will be described hereinafter, referring to FIGS. 3A–3E.

Figure 1A:
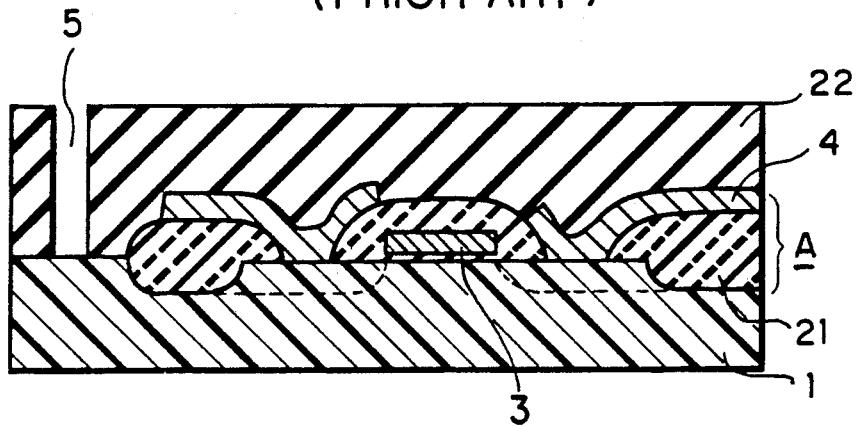
FIGS. 1A to 1G are sectional views of assistance in explaining processes of a conventional stacked semiconductor device manufacturing method.
Figure 1B:
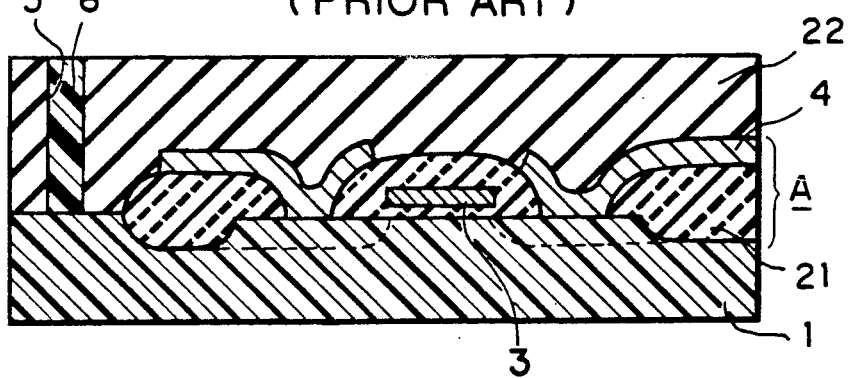
Figure 1C:
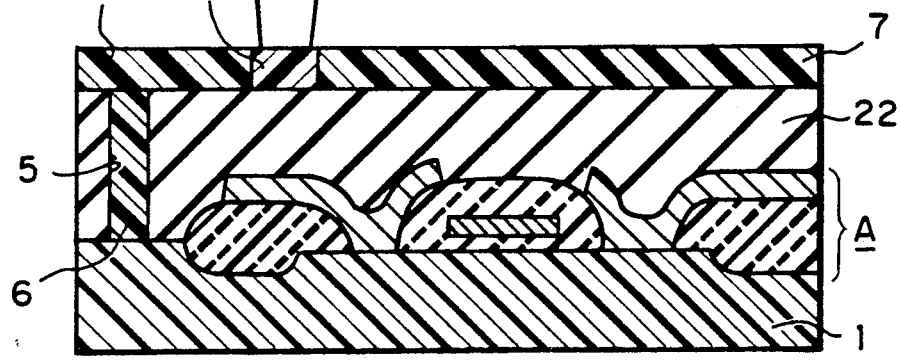
Figure 1D:
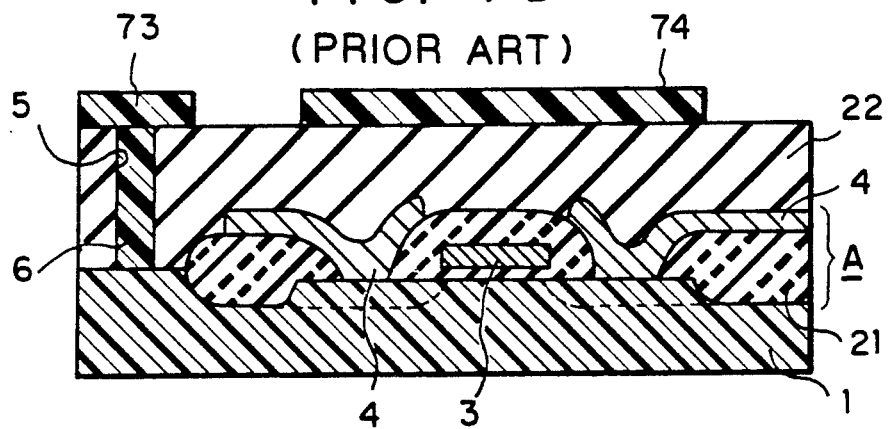
Figure 1E:
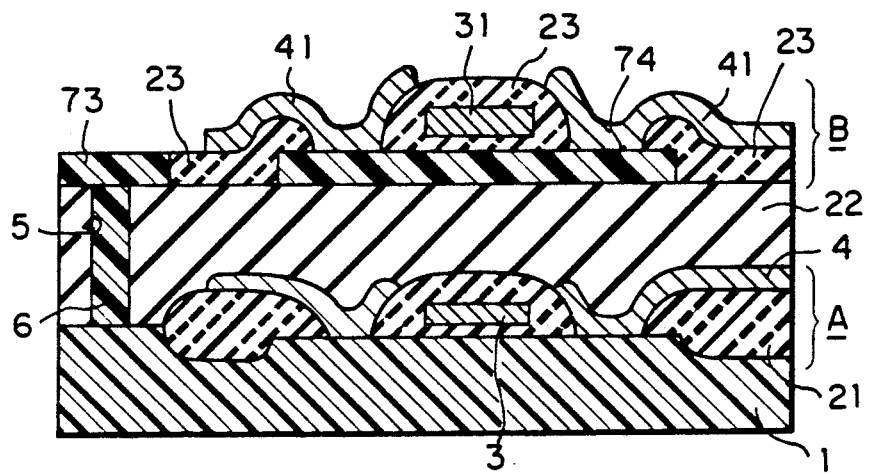
Figure 3A:
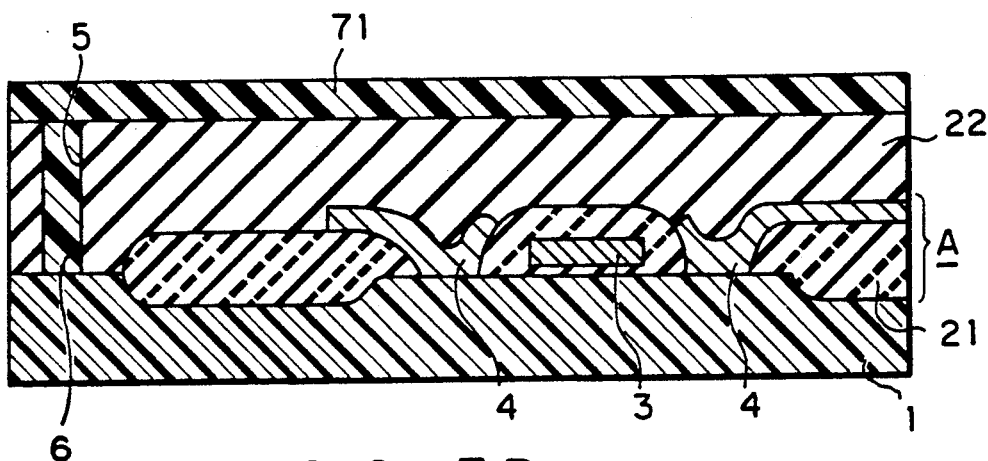
FIGS. 3A to 3E are sectional views of assistance in explaining steps in the method of manufacturing the stacked semiconductor device of FIG. 2.
Figure 3B:
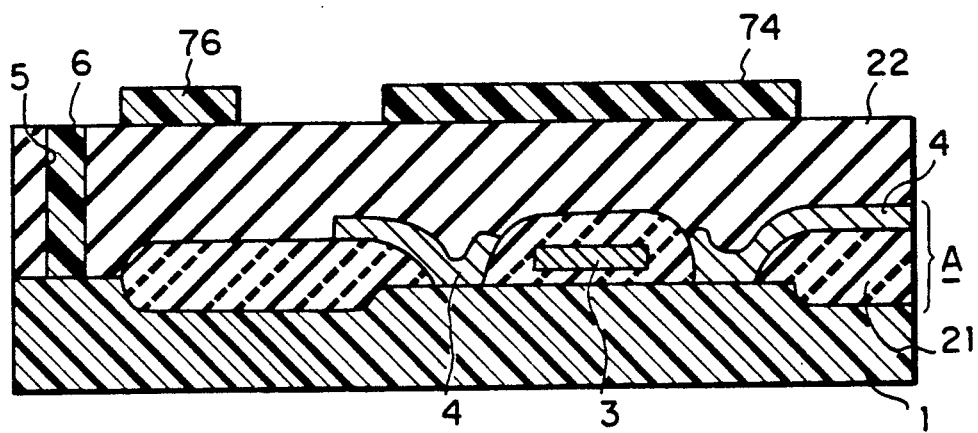

FIG. 3A shows a semifinished stacked semiconductor device, which is the same as that shown in FIG. 1C at a stage after the completion of irradiation by a laser beam, having the first layer insulating oxide film 22, the first epitaxial silicon layer 6 and a single crystal silicon layer 71 which are formed over the first MOS transistor A. The single crystal silicon layer 71 is etched by a photographic etching process to form the single crystal silicon layer 76, namely, the seed, and a single crystal silicon layer 74 for forming the second MOS transistor B. As shown in FIG. 3B, the single crystal silicon layer 76 which serves as a seed for the polycrystalline silicon 61 is formed apart from the epitaxial silicon layer 6.

Figure 3C:
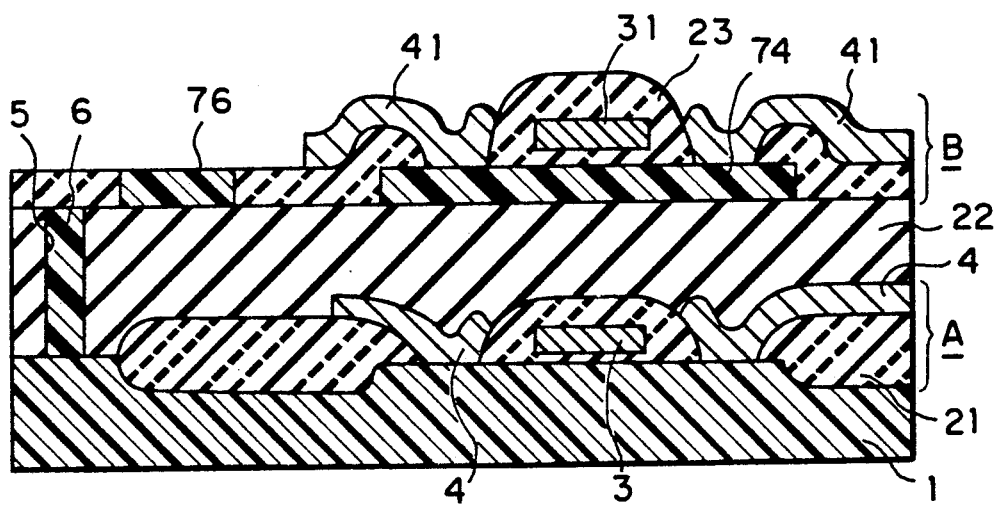
Figure 3D:
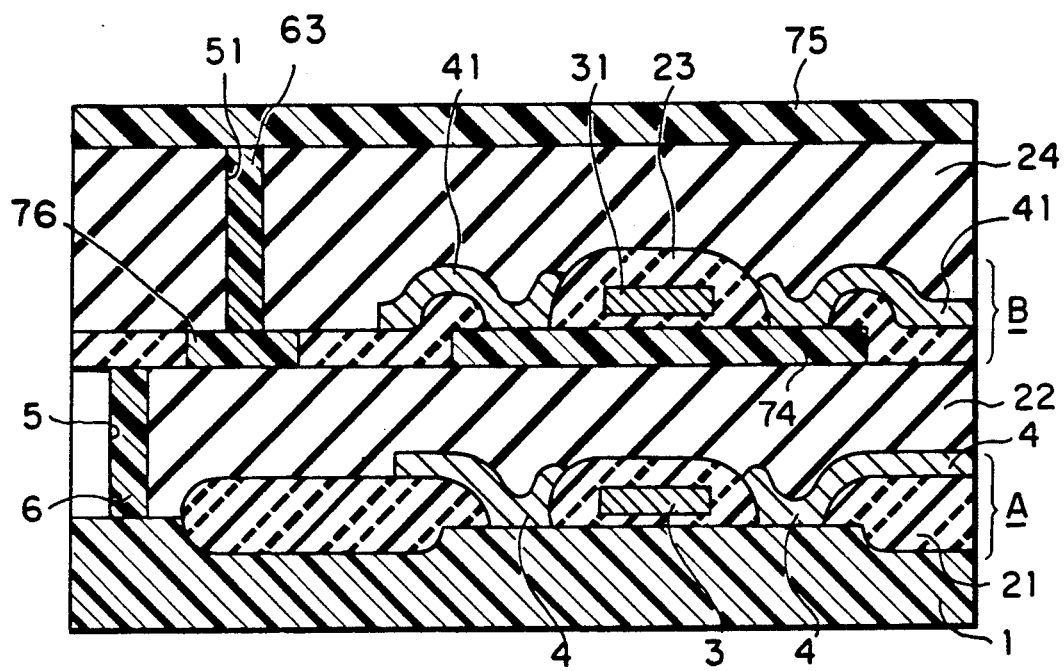
Figure 3E:
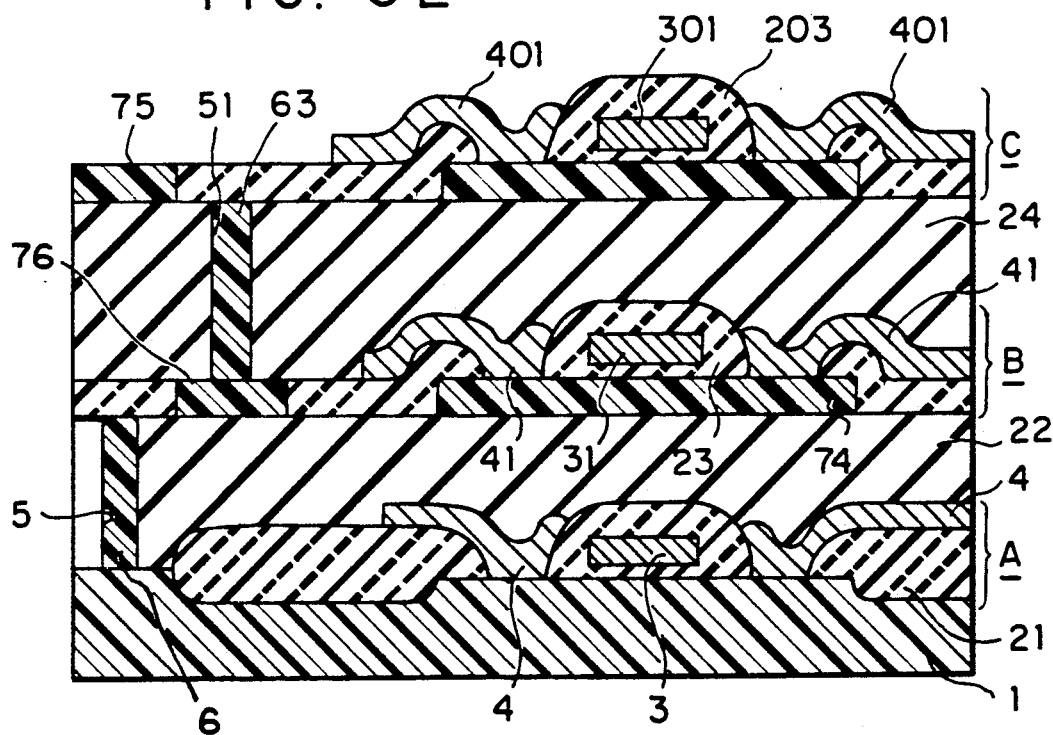

As shown in FIG. 3C, the second MOS transistor B is formed on the single crystal silicon layer 74. Then, as shown in FIG. 3D, the second layer insulating oxide film 24 is formed over the second MOS transistor B, the second layer insulating oxide film 24 is smoothed, the second opening 51 is formed through the second layer insulating oxide film 24 at a position corresponding to the single crystal silicon layer 76, and then the polycrystalline silicon 61 is formed in the second opening 51 by CVD technique. Then, a second polycrystalline silicon layer, not shown, is formed over the semifinished stacked semiconductor device, and the, the second polycrystalline silicon layer and polycrystalline silicon 61 are irradiated by a laser beam to form the second single crystal silicon layer 75 and single crystal silicon 63. Finally, as shown in FIG. 3E, the single crystal silicon layer 75 is etched to form a third MOS transistor C in a process the same as the conventional process to obtain the three-dimensional three-layer stacked semiconductor device.

Figure 1F:
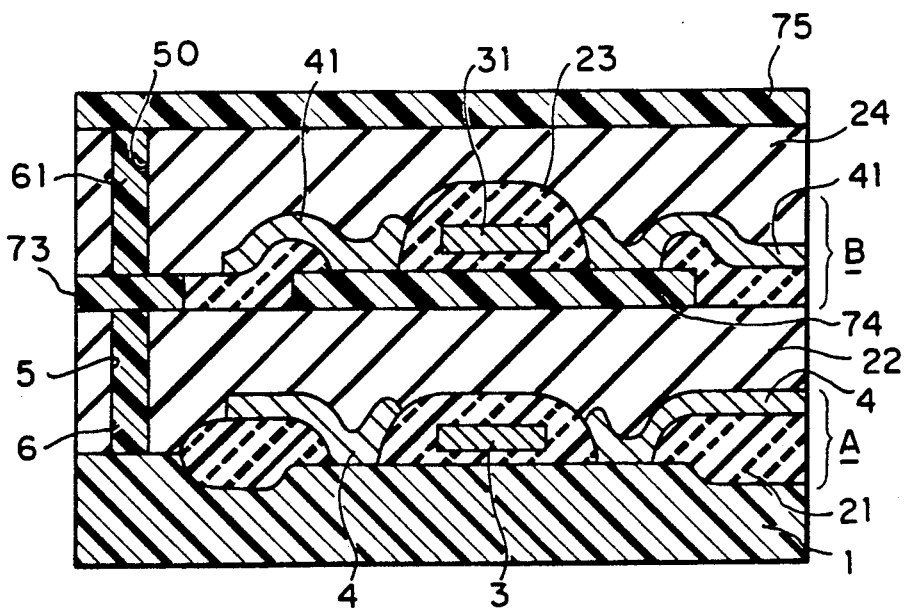
Figure 1G:
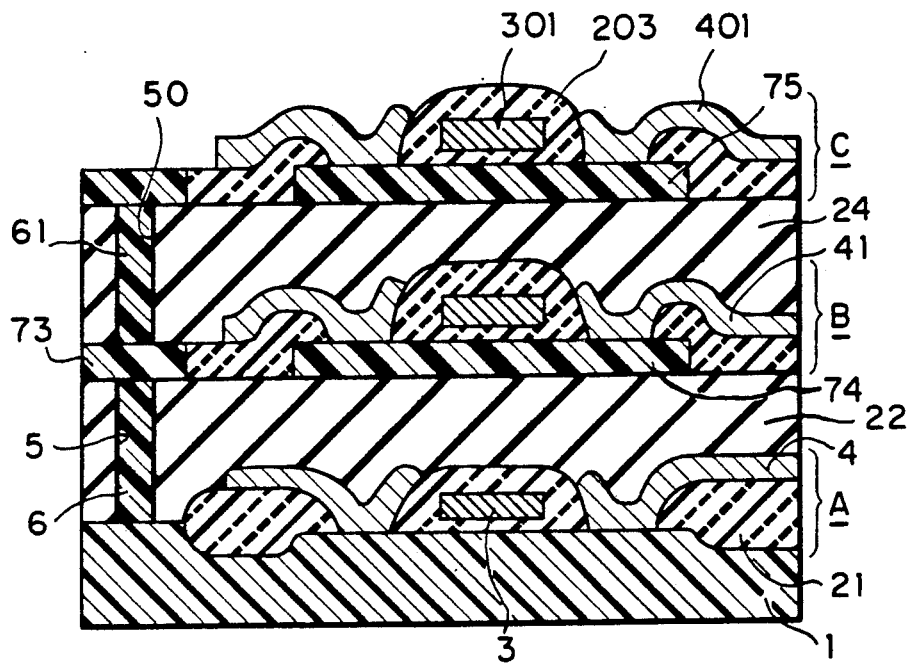

The state of the semifinished stacked semiconductor device shown in FIG. 2 corresponds to that of the semifinished stacked semiconductor device shown in FIG. 1F, in which the second polycrystalline silicon layer has not yet been irradiated by a laser beam. In the semifinished stacked semiconductor device shown in FIG. 2, the opening 51 for the third layer is spaced apart from the opening 5 for the second layer by a distance of 8 $\mu$m. The single crystal silicon 76 need not always be connected to the epitaxial silicon 6 (as shown in FIG. 2) but may be arranged as shown in FIGS. 3B-3E.

Figure 4A:
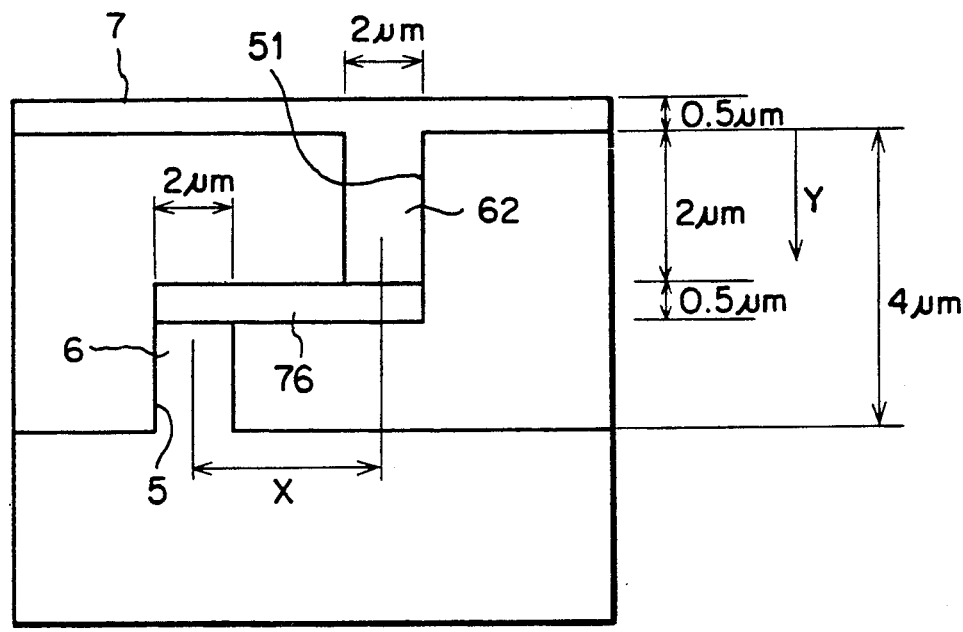
FIG. 4A is a diagrammatic illustration of assistance in explaining the result of simulation for determining the relation between the distance between openings, and the depth of penetration.
Figure 4B:
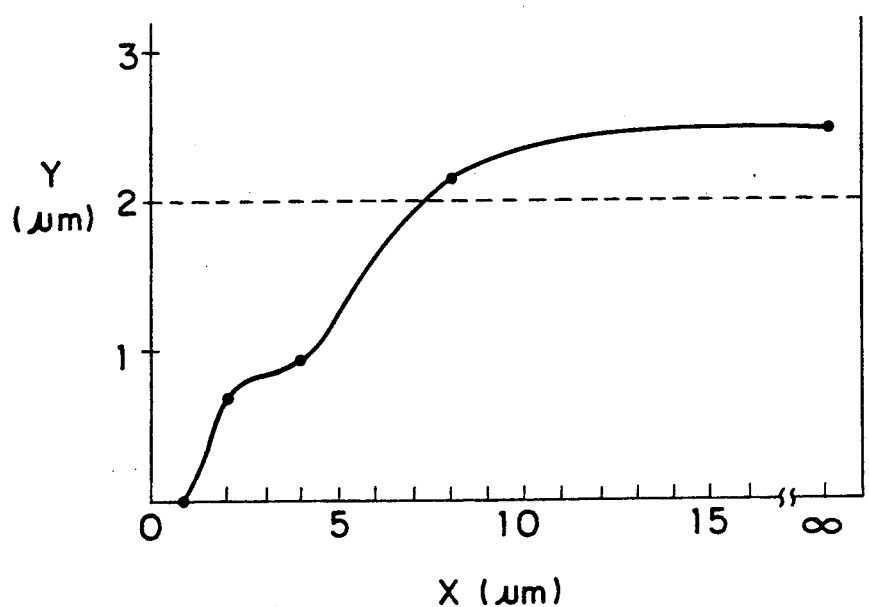
FIG. 4B is a graph showing the result of the simulation in terms of the variation of the depth of penetration with the distance between openings.

FIG. 4A shows the result of the simulated irradiation of the polycrystalline silicon layer 7 by a laser beam when the openings 5 and 51 are spaced apart. FIG. 4B shows the variation of the depth of penetration Y from the surface of the second layer insulating oxide film 24 in the polycrystalline silicon 62 with the distance X between the openings 5 and 51 when the polycrystalline silicon layer 7 is irradiated by a laser beam, where the diameter of each of the openings 5 and 51 is 2 $\mu$m, the total thickness of the layer insulating oxide films is 4 $\mu$m (2 $\mu$m for each layer insulating oxide film), and the respective thicknesses of the second semiconductor layer (a single crystal silicon layer 73 which are recrystallized by the laser beam and the third semiconductor layer (the polycrystalline silicon layer 7) are 0.5 $\mu$m.

As is obvious from FIGS. 4A and 4B, the depth of penetration Y is greater than 2 $\mu$m when the distance X exceeds 8 $\mu$m. Since the depth of the polycrystalline silicon layer 7 from the upper surface of the layer insulating oxide film is 2 $\mu$m, lateral epitaxial growth occurs when the distance X is 8 $\mu$m or above, where the depth of penetration Y is greater than 2 $\mu$m.

In view of the foregoing fact found through simulation, in the stacked semiconductor device shown in FIG. 2, the opening 51 is spaced apart horizontally from the opening 5 of the lower layer by a distance of 8 $\mu$m. Therefore, the polycrystalline silicon 61 deposited in the opening 51 is melted completely when irradiated by a laser beam and lateral epitaxial growth using the single crystal silicon layer 76 as a seed occurs, and thereby the polycrystalline silicon 61 and polycrystalline silicon layer 75 are changed into layers of single crystal silicon having the same crystal axis as the silicon forming the single crystal silicon substrate 1. Thereafter, the third MOS transistor C is formed by the foregoing conventional method on the single crystal silicon layer formed by recrystallizing the polycrystalline silicon layer 75.

Thus, in this embodiment, the single crystal silicon layer 76 serving as a seed for the polycrystalline silicon 61 is formed apart from the first epitaxial silicon layer 6, and the polycrystalline silicon 61 is deposited in the opening 51 formed in the second layer insulating oxide film 24 formed over the single crystal silicon layer 76. Accordingly, the polycrystalline silicon 61 for aligning the crystal axis of the second single crystal silicon layer 75 and the first epitaxial silicon layer 6 are separated. Consequently, heat loss attributable to thermal conduction during laser beam irradiation is reduced and hence the second polycrystalline silicon layer formed over the polycrystalline silicon 61 can be melted. Accordingly, lateral epitaxial growth over the second layer insulating oxide film 24 is possible, and thereby the single crystal silicon layer 75 having the same crystal axis as the single crystal silicon substrate 1 can be formed over the second layer insulating oxide film 24, which provides the stacked semiconductor device with satisfactory electrical characteristics.

Although the present invention has been described as applied to a three-layer stacked semiconductor device having MOS transistors, the present invention is applicable also to stacked semiconductor devices having more three layers, and to those having circuit elements other than MOS transistors, such as diodes or capacitors. Furthermore, epitaxial silicon may be grown instead of polycrystalline silicon in the openings 5 and 51 for the same effect.

Still further, the shape of the openings need not necessarily be limited to a square shape.

As apparent from the foregoing description, according to the present invention, since the opening for an upper layer of a semiconductor circuit element is formed in a layer insulating oxide film at a position displaced from a position corresponding to that of an opening for a lower layer of a semiconductor circuit element, and a semiconductor layer for taking the crystal axis of the lower layer of the semiconductor circuit element is deposited in the opening for the upper layer, satisfactory lateral epitaxial growth occurs over the layer insulating oxide film to provide a stacked semiconductor device having satisfactory electrical characteristics.

Furthermore, according to the present invention, since the openings has an area of 9 $\mu$m$^2$ or below, and the opening for the upper layer and the opening for the lower layer are spaced apart by a horizontal distance of 8 $\mu$m or above, satisfactory lateral epitaxial growth occurs during recrystallization for the third layer and above, so that a high-quality stacked semiconductor device can be manufactured.

What is claimed is:

1. A stacked semiconductor device comprising a plurality of alternate layers of semiconductor elements and insulating layers, in which the number of said semiconductor element layers is two or more, formed on a semiconductor substrate, characterized in that the upper insulating layer among the adjacent insulating layers is provided with an opening formed therethrough so as to reach the lower layer of semiconductor element immediately below the upper insulating layer, the opening of the upper insulating layer is formed at a position spaced apart horizontally from the position of an opening of the lower insulating layer reaching the semiconductor substrate, and a semiconductor layer for forming an upper layer of semiconductor element having the same crystal axis as the lower layer of the semiconductor element on the upper insulating layer is formed in the opening of the upper insulating layer.

2. A stacked semiconductor device according to claim 1, wherein said semiconductor substrate is formed of silicon having a principal plane of [100] or a principal plane equivalent to the principal plane of [100].

3. A stacked semiconductor device according to claim 2, wherein said semiconductor substrate is a single crystal semiconductor layer.

4. A stacked semiconductor device according to claim 1, wherein said semiconductor substrate is a single crystal semiconductor layer.

5. A stacked semiconductor device comprising:
a single crystal semiconductor substrate;
a plurality of two or more layers of semiconductor elements stacked on the single crystal semiconductor substrate in a three-dimensional arrangement with insulating layers, each insulating layer being formed between adjacent upper and lower layers of semiconductor elements to electrically insulate the adjacent upper and lower layers of semiconductor elements, and each insulating layer being provided with an opening formed therethrough and filled with a semiconductor layer; and
each single crystal semiconductor layer having the same crystal axis as the single crystal semiconductor substrate, formed over each insulating layer, said upper layer of a semiconductor element being formed on the single crystal semiconductor layer formed over the lower insulating layer immediately below the upper layer of a semiconductor element;
characterized in that the area of each of said openings is 9 $\mu m^2$ or below, and the opening for forming the semiconductor element of the second layer or above is spaced apart horizontally from the opening formed in the adjacent lower layer by a distance of 8 $\mu m$ or above.

6. A stacked semiconductor device according to claim 5, wherein said semiconductor substrate is formed of silicon having a principal plane of [100] or a principal plane equivalent to the principal plane of [100].

7. A stacked semiconductor device formed by the process comprising the steps of:
fabricating a first active circuit element on a single crystal semiconductor substrate;
forming an insulating layer over said active circuit element;
forming an opening in said insulating layer through to said substrate;
forming semiconductor material in said opening contacting said substrate;
forming a first layer of semiconductor material over said insulating layer and said opening;
recrystallizing said first layer of semiconductor material with a crystal orientation corresponding to that of said substrate;
dividing said recrystallized layer into an active circuit element portion and a seed portion, said seed portion being spaced apart from said opening in a horizontal direction;
forming a second insulating layer over said active circuit element portion and said seed portion;
forming a second opening in said second insulating layer through to said seed portion;
forming semiconductor material in said second opening contacting said seed portion;
forming a second layer of semiconductor material over said second insulating layer and said second opening; and
recrystallizing said second layer of semiconductor material with a crystal orientation corresponding to that of said seed portion.

* * * * *

UNITED STATES PATENT AND TRADEMARK OFFICE
CERTIFICATE OF CORRECTION

PATENT NO. : 5,128,732

DATED : July 7, 1992

INVENTOR(S) : Kazuyuki Sugahara et al.

It is certified that error appears in the above-identified patent and that said Letters Patent is hereby corrected as shown below:

```
Column 2, line 9, "application" should be --applications--;
         line 12, "eteching" should be --etching--;
         line 18, "b" should be --B--;
         line 26, "A" should be --As--.

Column 5, line 7, "the" should be --then--.
```

Signed and Sealed this

Fourteenth Day of September, 1993

Attest:

BRUCE LEHMAN

*Attesting Officer*  *Commissioner of Patents and Trademarks*